US012604540B2

(12) United States Patent
Liao et al.

(10) Patent No.: US 12,604,540 B2
(45) Date of Patent: Apr. 14, 2026

(54) BACK PANEL OF SOLAR CELL AND METHOD FOR MANUFACTURING THE SAME

(71) Applicant: NAN YA PLASTICS CORPORATION, Taipei (TW)

(72) Inventors: Te-Chao Liao, Taipei (TW); Ching-Yao Yuan, Taipei (TW); Yu-Chi Hsieh, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 559 days.

(21) Appl. No.: 18/071,591

(22) Filed: Nov. 29, 2022

(65) Prior Publication Data

US 2024/0136454 A1 Apr. 25, 2024

(30) Foreign Application Priority Data

Oct. 7, 2022 (TW) .................................. 111138115

(51) Int. Cl.

| | |
|---|---|
| ***H01L 31/049*** | (2014.01) |
| ***B32B 5/02*** | (2006.01) |
| ***B32B 27/12*** | (2006.01) |
| ***B32B 27/30*** | (2006.01) |
| ***C08J 5/24*** | (2006.01) |
| ***C09D 127/14*** | (2006.01) |
| ***H10F 19/85*** | (2025.01) |
| *B32B 7/12* | (2006.01) |

(52) U.S. Cl.

CPC ............. *H10F 19/85* (2025.01); *B32B 5/022* (2013.01); *B32B 27/12* (2013.01); *B32B 27/304* (2013.01); *C08J 5/244* (2021.05); *C09D 127/14* (2013.01); *B32B 5/024* (2013.01); *B32B 7/12* (2013.01); *B32B 2255/02* (2013.01); *B32B 2260/021* (2013.01); *B32B 2260/046* (2013.01); *B32B 2262/101* (2013.01); *B32B 2307/3065* (2013.01); *B32B 2307/71* (2013.01); *B32B 2307/7246* (2013.01); *B32B 2307/732* (2013.01); *B32B 2457/12* (2013.01); *C08J 2363/00* (2013.01); *C08J 2463/00* (2013.01)

(58) Field of Classification Search

CPC ....... H10F 19/85; B32B 27/12; B32B 27/304; B32B 5/022; B32B 5/024; B32B 7/12; B32B 2255/02; B32B 2260/021; B32B 2260/046; B32B 2262/101; B32B 2307/3065; B32B 2307/71; B32B 2307/7246; B32B 2307/732; B32B 2457/12; C08J 5/244; C08J 2363/00; C08J 2463/00; C09D 127/14

See application file for complete search history.

(56) References Cited

U.S. PATENT DOCUMENTS

| | | | | |
|---|---|---|---|---|
| 2012/0071585 | A1 | 3/2012 | Nohara et al. | |
| 2014/0107254 | A1 | 4/2014 | Iwata et al. | |
| 2015/0144194 | A1 | 5/2015 | Kajisa et al. | |
| 2015/0245476 | A1* | 8/2015 | Akahane .............. | H05K 1/0366 442/180 |
| 2019/0334046 | A1 | 10/2019 | Ikoma et al. | |
| 2020/0048420 | A1* | 2/2020 | Hosoda ................... | B32B 27/12 |

FOREIGN PATENT DOCUMENTS

| | | | | | |
|---|---|---|---|---|---|
| CN | 108440901 | A | * | 8/2018 | ............. B32B 27/38 |
| CN | 111484600 | A | * | 8/2020 | ........... C08G 59/621 |
| JP | 200260460 | A | | 2/2002 | |
| JP | 201126554 | A | | 2/2011 | |
| JP | 2011216779 | A | | 10/2011 | |
| TW | 201105696 | A1 | | 2/2011 | |
| TW | 201307420 | A1 | | 2/2013 | |
| TW | 201900742 | A | | 1/2019 | |
| WO | WO2014007150 | A1 | | 1/2014 | |
| WO | WO2018150905 | A1 | | 8/2018 | |

OTHER PUBLICATIONS

Machine translation of CN 111484600 A (Year: 2020).*
Machine Translation of CN 108440901 A (Year: 2018).*

* cited by examiner

*Primary Examiner* — Callie E Shosho
*Assistant Examiner* — Bethany M Miller
(74) *Attorney, Agent, or Firm* — Li & Cai Intellectual Property Office

(57) ABSTRACT

A back panel of a solar cell and a method for manufacturing the same are provided. The back panel includes a prepreg and a fluorine-containing polymer layer, and the fluorine-containing polymer layer is formed on the prepreg. The prepreg is formed by immersing a fiber substrate into a resin composition. Based on a total weight of the resin composition being 100 PHR (parts per hundred resin), the resin composition includes: 5 PHR to 70 PHR of a first epoxy resin, 1 PHR to 20 PHR of a hardener, and 0.01 PHR to 10 PHR of an accelerant. The first epoxy resin contains phosphorus atoms, and an amount of the phosphorus atoms in the first epoxy resin ranges from 0.1 wt % to 5 wt %.

9 Claims, 2 Drawing Sheets

BACK PANEL OF SOLAR CELL AND METHOD FOR MANUFACTURING THE SAME

CROSS-REFERENCE TO RELATED PATENT APPLICATION

This application claims the benefit of priority to Taiwan Patent Application No. 111138115, filed on Oct. 7, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a back panel of a solar cell and a method for manufacturing the same, and more particularly to a back panel of a solar cell that has good weather resistance and a method for manufacturing the same.

BACKGROUND OF THE DISCLOSURE

Generally speaking, a solar cell module mainly includes a glass cover plate, an ethylene-vinyl acetate (EVA) copolymer layer, a solar cell and a back panel. In the whole solar cell module, the back panel is a component that has the largest contact area with an external environment. The configuration of the back panel can not only support the whole solar cell module, but also isolate the solar cell from the external environment, so as to achieve an effect of protecting the solar cell.

In order to receive abundant light energy, the solar cell module is usually set up outdoors. As such, the solar cell module is required to possess good weather resistance and heat resistance for withstanding outdoor sunlight and rain. Moreover, the solar cell module is required to possess a good barrier property and a good impact strength, so that penetration of microparticles, liquid or water vapor from the external environment can be prevented. The solar cell is likely to be damaged as a result of undesirable entry of external microparticles, liquid or water vapor, and its photoelectric conversion efficiency can even be affected. Therefore, for the solar cell module, the weather resistance, the heat resistance, the barrier property and the impact strength of the back panel are important factors that can affect the service life of the solar cell module.

Conventionally, a polyethylene terephthalate (PET) plate is used as a substrate of a back panel structure currently available on the market. One side of the PET plate is configured to include a fluorine-containing polymer layer by heat lamination, and the fluorine-containing polymer layer enables the back panel to possess good weather resistance, good heat resistance, a good barrier property, and a good impact strength. A polyvinyl fluoride (PVF) layer is provided on another side of the PET plate through an adhesive, and the PVF layer can bond the back panel to the solar cell module. Finally, it is necessary for the back panel structure to age for 7 days at a temperature of 60° C., so as to complete a manufacturing process of the back panel.

That is to say, during the manufacturing process of the back panel, the PET plate at least undergoes one lamination step and one adhesive coating step. Hence, a manufacturer of the back panel needs two different processing apparatuses. In addition, when the back panel is applied to the solar cell module, additional lamination packaging is required, thereby increasing the complexity of the whole manufacturing process.

Therefore, how to improve the back panel structure, so as to improve the manufacturing process of the back panel and enable the back panel to have good weather resistance, good heat resistance, a good barrier property and a good impact strength, has become one of the important issues to be solved in the solar cell industry.

SUMMARY OF THE DISCLOSURE

In response to the above-referenced technical inadequacies, the present disclosure provides a back panel of a solar cell and a method for manufacturing the same.

In one aspect, the present disclosure provides a back panel of a solar cell. The back panel includes a prepreg and a fluorine-containing polymer layer, and the fluorine-containing polymer layer is formed on the prepreg. The prepreg is formed by immersing a fiber substrate into a resin composition. Based on a total weight of the resin composition being 100 PHR (parts per hundred resin), the resin composition includes: 5 PHR to 70 PHR of a first epoxy resin, 1 PHR to 20 PHR of a hardener and 0.01 PHR to 10 PHR of an accelerant. The first epoxy resin contains phosphorus atoms, and an amount of the phosphorus atoms in the first epoxy resin ranges from 0.1 wt % to 5 wt %.

In some embodiments, a structure of the first epoxy resin is represented by at least one of the following formulas (a) to (d):

(a)

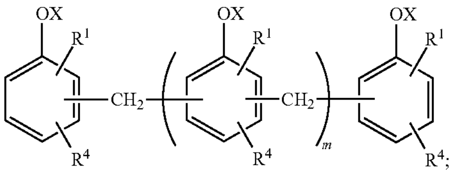

(b)

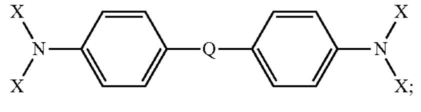

(c)

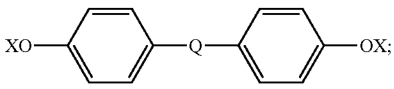

and (d)

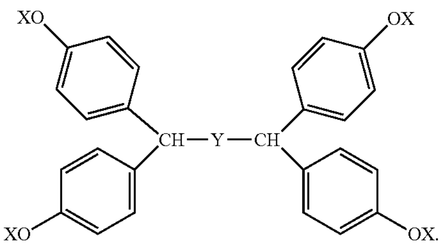

At least one X in the formulas (a) to (d) denotes

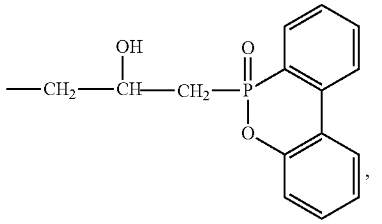

and remaining ones of X denote

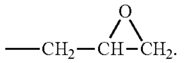

$R^1$ in the formula (a) denotes a hydrogen atom or hydrocarbonyl with 1 to 4 carbon atoms, and $R^4$ and $R^5$ each denote a hydrogen atom, methyl or

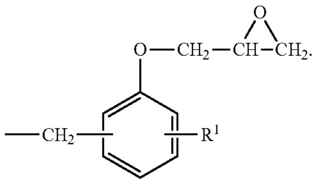

In addition, m is an integer from 0 to 12.

Q in the formulas (b) and (c) denotes

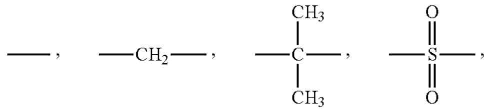

or

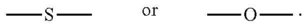

Y in the formula (d) denotes $-(CH_2)_n-$ or phenylene, and n is an integer from 0 to 6.

In some embodiments, the first epoxy resin is grafted with 6H-dibenzo[c,E][1,2]oxaphosphinine 6-oxide (DOPO).

In some embodiments, an epoxy equivalent of the first epoxy resin ranges from 200 g/eq to 1,000 g/eq, and a weight-average molecular weight of the first epoxy resin ranges from 100 g/mol to 1,000 g/mol.

In some embodiments, the resin composition further includes 1 PHR to 50 PHR of a second epoxy resin, and an epoxy equivalent of the second epoxy resin ranges from 100 g/eq to 2,000 g/eq.

In some embodiments, the second epoxy resin is selected from a group consisting of: a bisphenol A epoxy resin, a bisphenol F epoxy resin, a polybutadiene epoxy resin, a cresol formaldehyde novolac epoxy resin, a phenol formaldehyde novolac epoxy resin, a phenol biphenyl formaldehyde novolac epoxy resin, a phenol p-xylene formaldehyde novolac epoxy resin, a phenol biphenylene formaldehyde novolac epoxy resin, a phenol dicyclopentadiene formaldehyde novolac epoxy resin, a benzaldehyde novolac epoxy resin, a propylene glycol formaldehyde novolac epoxy resin, a resorcinol novolac epoxy resin, and any combination thereof.

In some embodiments, the fiber substrate has a thickness that ranges from 0.05 mm to 0.5 mm, and the back panel of the solar cell has a light transmittance of above or equal to 85%.

In some embodiments, a material of the fluorine-containing polymer layer is selected from a group consisting of: polyfluoroalkoxy (PFA), fluorinated ethylene propylene (FEP), ethylene tetrafluoroethylene (ETFE), an ethylene chlorotrifluoroethylene (ECTFE) copolymer, polyvinyl fluoride (PVF), polyvinylidene fluoride (PVDF), and any combination thereof.

In another aspect, the present disclosure provides a method for manufacturing a back panel of a solar cell. The method includes: immersing a fiber substrate into a resin composition to form a prepreg; and forming a fluorine-containing polymer layer on the prepreg. Based on a total weight of the resin composition being 100 PHR (parts per hundred resin), the resin composition includes: 5 PHR to 70 PHR of a first epoxy resin, 1 PHR to 20 PHR of a hardener, and 0.01 PHR to 10 PHR of an accelerant. The first epoxy resin contains phosphorus atoms, and an amount of the phosphorus atoms in the first epoxy resin ranges from 0.1 wt % to 5 wt %.

Therefore, in the back panel of the solar cell and the method for manufacturing the same provided by the present disclosure, by virtue of "the first epoxy resin containing phosphorus atoms, and an amount of the phosphorus atoms in the first epoxy resin ranging from 0.1 wt % to 5 wt %" and "a fluorine-containing polymer layer being formed on the prepreg," the back panel of the solar cell can have improved heat resistance and weather resistance.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
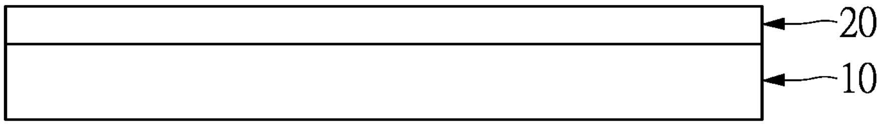
FIG. 1 is a schematic side view of a back panel of a solar cell according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Through material selection, a back panel of the present disclosure has good weather resistance, good heat resistance, a good barrier property, and a good impact strength. Manufacturing of the back panel can be completed simply through a lamination packaging step in a manufacturing process of the back panel, thereby solving the problem that back panel factories conventionally need two different processing apparatuses for operations.

Moreover, when assembling a solar cell module, a downstream manufacturer also needs the processing apparatus for lamination packaging. Hence, the manufacturing of the back panel can be integrated into a manufacturing process of the solar cell module, so as to save the space and time required by factory operations.

Accordingly, the back panel of the present disclosure not only has good physical properties, but can also be manufactured by a simple process. In addition, the back panel of the present disclosure can be directly applied to an assembly factory of the solar cell module, and there is no need to additionally set up the back panel factory.

Furthermore, the back panel of the present disclosure has a light transmittance of above or equal to 85%, and thus can be applied to a solar cell module capable of double-sided power generation. Compared with a solar cell module with single-sided light transmission (using a white back panel), a solar cell module with double-sided light transmission (using a transparent back panel) can have an increased light conversion efficiency (about 20%).

Referring to FIG. 1, the back panel of the present disclosure includes a prepreg 10 and a fluorine-containing polymer layer 20, and the fluorine-containing polymer layer 20 is formed on the prepreg 10. The prepreg 10 is a packaging surface of the back panel, which is bonded to a polymer layer in the solar cell module. The fluorine-containing polymer layer 20 is an outer side surface of the back panel, and is a structure that is exposed to the outside and mainly used to protect a solar cell. That is to say, both the prepreg 10 and the fluorine-containing polymer layer 20 of the present disclosure have a light transmitting property.

Compared with a conventional back panel, the prepreg 10 in the present disclosure is equivalent to a PET plate and a PVF layer in the conventional back panel. The prepreg 10 can be bonded to the solar cell module and serve as a substrate at the same time. Therefore, compared with the conventional back panel, the back panel of the present disclosure is thinner and lighter, and its manufacturing process is simpler.

The prepreg 10 is formed by immersing a fiber substrate into a resin composition followed by partial curing or complete curing. Specifically, a crosslinking degree of the prepreg 10 can be controlled to range from 20% to 100%.

When the back panel is assembled to the solar cell module, the prepreg 10 is bonded to the polymer layer in the solar cell module. Hence, the crosslinking degree of the prepreg 10 is controlled to range from 30% to 80%, which is conducive to a follow-up bonding of the prepreg 10 to the polymer layer. Preferably, the crosslinking degree of the prepreg 10 is controlled to range from 50% to 60%.

The resin composition of the present disclosure includes: 5 PHR to 70 PHR of a first epoxy resin, 0 PHR to 50 PHR of a second epoxy resin, 1 PHR to 20 PHR of a hardener, 0.01 PHR to 10 PHR of an accelerant, and 0.01 PHR to 10 PHR of a processing aid. In the present disclosure, the resin composition does not include halogen.

Since phosphorus atoms in the first epoxy resin have an amount of less than 5 wt %, weather resistance and heat resistance of the resin composition upon curing can be improved. Preferably, the amount of the phosphorus atoms in the first epoxy resin ranges from 0.1 wt % to 5 wt %. More preferably, the amount of the phosphorus atoms in the first epoxy resin ranges from 2 wt % to 3 wt %.

Specifically, a structure of the first epoxy resin can be represented by at least one of the following formulas (a) to (d):

(a)

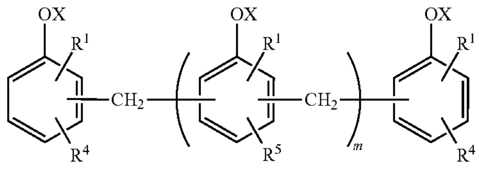

;

(b)

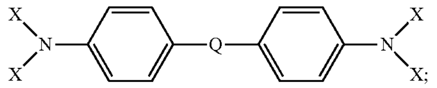

(c)

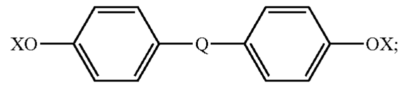

and

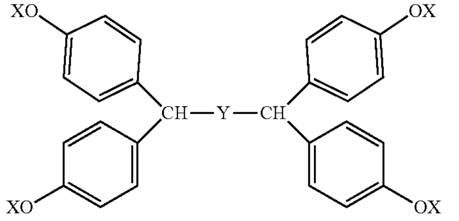

(d).

At least one X in the formulas (a) to (d) denotes

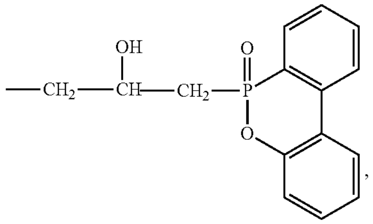

and remaining ones of X denote

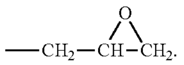

$R^1$ in the formula (a) denotes a hydrogen atom or hydrocarbonyl with 1 to 4 carbon atoms, and $R^4$ and $R^5$ each denote a hydrogen atom, methyl or

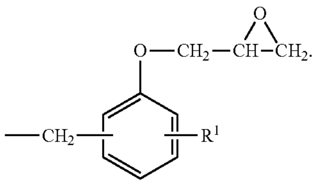

In addition, m is an integer from 0 to 12.

Q in the formulas (b) and (c) denotes

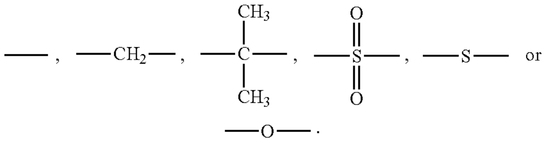

It should be noted that the abovementioned "~" indicates that Q is a carbon bond. That is to say, a main structure in the formulas (b) and (c) may be biphenyl. In one exemplary embodiment, Q denotes methylene ($—CH_2—$).

Y in the formula (d) denotes $—(CH_2)_n—$ or phenylene, and n is an integer from 0 to 6.

In one exemplary embodiment, when the structure of the first epoxy resin is represented by the formula (d), the back panel may have good weather resistance and heat resistance. However, the present disclosure is not limited thereto.

As shown in the formulas (a) to (d), the first epoxy resin is grafted with 6H-dibenzo[c,E][1,2]oxaphosphinine 6-oxide (DOPO), so as to improve the weather resistance and the heat resistance of the resin composition upon curing.

In some embodiments, the first epoxy resin has a weight-average molecular weight of 100 g/mol to 1,000 g/mol. If the weight-average molecular weight of the first epoxy resin is too high, non-uniform immersion is likely to occur. If the weight-average molecular weight of the first epoxy resin is too low, immersion lines will appear and result in poor light transmittance. Preferably, the weight-average molecular weight of the first epoxy resin ranges from 100 g/mol to 800 g/mol. More preferably, the weight-average molecular weight of the first epoxy resin ranges from 300 g/mol to 700 g/mol.

In some embodiments, an epoxy equivalent of the first epoxy resin ranges from 200 g/eq to 1,000 g/eq. Preferably, the epoxy equivalent of the first epoxy resin ranges from 200 g/mol to 700 g/mol. More preferably, the epoxy equivalent of the first epoxy resin ranges from 200 g/mol to 300 g/mol.

In the present disclosure, the second epoxy resin is optionally added to the resin composition, so as to improve the physical strength of the resin composition upon cross-linking. In this way, the barrier property and the impact strength of the back panel can be further enhanced. The second epoxy resin may be a bifunctional epoxy resin or a multifunctional epoxy resin, and the bifunctional or multi-functional epoxy resin means that each molecule contains two or more functional groups capable of participating in polymerization. A molecular structure of the second epoxy resin is different from that of the first epoxy resin. Specifically, the second epoxy resin does not contain the phosphorus atoms.

In one exemplary embodiment, the resin composition includes 1 PHR to 50 PHR of the second epoxy resin, and an epoxy equivalent of the second epoxy resin ranges from 100 g/eq to 2,000 g/eq. Preferably, the epoxy equivalent of the second epoxy resin ranges from 200 g/eq to 800 g/eq. More preferably, the epoxy equivalent of the second epoxy resin ranges from 200 g/eq to 500 g/eq.

The second epoxy resin is selected from a group consisting of: a bisphenol A epoxy resin, a bisphenol F epoxy resin, a polybutadiene epoxy resin, a cresol formaldehyde novolac epoxy resin, a phenol formaldehyde novolac epoxy resin, a phenol biphenyl formaldehyde novolac epoxy resin, a phenol p-xylene formaldehyde novolac epoxy resin, a phenol biphenylene formaldehyde novolac epoxy resin, a phenol dicyclopentadiene formaldehyde novolac epoxy resin, a benzaldehyde novolac epoxy resin, a propylene glycol formaldehyde novolac epoxy resin, a resorcinol novolac epoxy resin, and any combination thereof.

In some embodiments, the hardener is selected from a group consisting of: amine compounds, anhydride compounds, a phenolic resin, polythiol compounds, isocyanate compounds, and an alkyd resin.

For example, the hardener may be primary amine, secondary amine or tertiary amine. For example, the amine compounds may be fatty amines (e.g., diethylenetriamine, triethylenetetramine, tetraethylenepentamine, diethylaminopropylamine and ethylenediamine), polyamide, alicyclic amines (e.g., bis(4-amino-3-methylcyclohexyl)methane and bis(4-aminocyclohexyl)methane), aromatic amines (e.g., m-xylylenediamine, diaminodiphenylmethane, diaminodiphenylsulfone and m-phenylenediamine), dicyandiamide, adipic dihydrazide, or any combination thereof. However, the present disclosure is not limited thereto.

For example, the hardener may be selected from a group consisting of: styrene maleic anhydride, phthalic anhydride, tetrahydrophthalic anhydride, hexahydrophthalic anhydride, methyltetrahydrophthalic anhydride, methylhexahydrophthalic anhydride, methyl-5-norbornene-2,3-dicarboxylic anhydride, dodecenylsuccinic anhydride, chlorendic anhydride, pyromellitic dianhydride, benzophenonetetracarboxylic dianhydride, ethylene glycol bis(trimellitic anhydride), methylcyclohexyltetracarboxylic dianhydride, trimellitic anhydride, polyazelaic polyanhydride, and any combination thereof. However, the present disclosure is not limited thereto.

For example, the hardener may be an o-cresol formaldehyde novolac resin, a phenol formaldehyde novolac resin, a phenol biphenyl formaldehyde novolac resin, a phenol p-xylene formaldehyde novolac resin, a phenol biphenylene formaldehyde novolac resin, a phenol dicyclopentadiene formaldehyde novolac resin, a benzaldehyde novolac resin, a propylene glycol formaldehyde novolac resin, a resorcinol novolac resin, a melamine phenol formaldehyde resin, or any combination thereof. However, the present disclosure is not limited thereto.

The accelerant can promote crosslinking between the epoxy resin (i.e., the first epoxy resin and the second epoxy resin) and the hardener, and an added amount of the accelerant can affect a reaction rate of the resin composition upon curing.

For example, the accelerant may be tertiary amines and salts thereof (e.g., 2,4,6-tris(dimethylamino)phenol and benzyldimethylamine), quaternary ammonium compounds, imidazoles (e.g., 2-methylimidazole, 2-ethyl-4-methylimidazole, 2-phenylimidazole and 1-benzyl-2-methylimidazole), ammonium tripentyl phenolate, monophenol compounds or polyphenol compounds (e.g., salicylic acid), complexes of boron trifluoride and organic substances thereof (e.g., boron trifluoride-ether complex, boron trifluoride-ammonium complex and boron trifluoride/monoethylammonium complex), phosphoric acid, triphenyl phosphite, or any combination thereof. However, the present disclosure is not limited thereto.

In some embodiments, the processing aid may be a coupling agent, a plasticizer, a dispersant, an antioxidant, a heat and light stabilizer, or a reinforcing filler. The coupling agent can be used to improve interfacial affinity between the fiber substrate and the resin composition. Other types of the processing aid can adjust the processing properties, physical properties, electrical properties or light or heat resistance of the resin composition upon curing.

For example, the coupling agent may be trimethoxysilane (TMS), dimethoxysilane (DMS), titanium aluminate, or any combination thereof. The plasticizer may be dimethyl phthalate, trioctyl trimellitate, dinonyl phthalate, or any combination thereof. The dispersant may be a low-molecular-weight acidic polyester, long-chain fatty alcohol, or any combination thereof. The antioxidant may be dilauryl thiodipropionate, di-tertiary butyl-hydroxyl toluene, or any combination thereof. The heat and light stabilizer may be benzophenone. A flame retardant may be tricresyl phosphate, triphenyl phosphate or cresyl diphenyl phosphate. The reinforcing filler may be calcium carbonate, molybdenum disulfide, or any combination thereof.

The fiber substrate may be a woven fabric or a non-woven fabric made by various weaving techniques, and patterns of the fiber substrate may be plain patterns, twill patterns, satin patterns or rib patterns. A material of the fiber substrate can be woven from glass fibers, carbon fibers, KEVLAR® fibers, polyester fibers, quartz fibers, or any combination thereof, but is not limited thereto.

In order to improve the light transmittance of the back panel, in the present disclosure, fibers having a diameter of from 7 microns to 13 microns (preferably from 8 microns to 12 microns, and more preferably from 9 microns to 11 microns) are used to weave the fiber substrate. The fiber substrate has a warp count of from 30 to 80 and a weft count of from 30 to 80. Preferably, the warp count is from 30 to 40, and the weft count is from 30 to 40. The fiber substrate has a surface density of from 100 $g/m^2$ to 300 $g/m^2$ (preferably from 200 $g/m^2$ to 250 $g/m^2$). The fiber substrate has a thickness that ranges from 0.05 mm to 0.5 mm (preferably from 0.1 mm to 0.3 mm).

Figure 2:
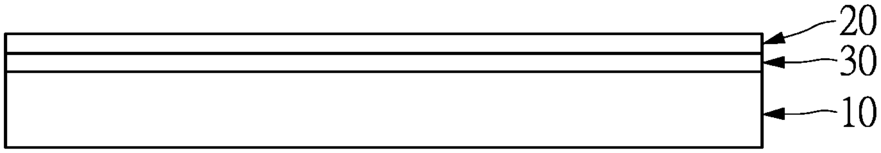
FIG. 2 is a schematic side view of the back panel of the solar cell according to a second embodiment of the present disclosure.

In some other embodiments, the back panel may further include an adhesive layer 30. Referring to FIG. 2, the adhesive layer 30 is disposed between the prepreg 10 and the fluorine-containing polymer layer 20, so that the fluorine-containing polymer layer 20 is tightly attached to the prepreg 10.

Figure 3:
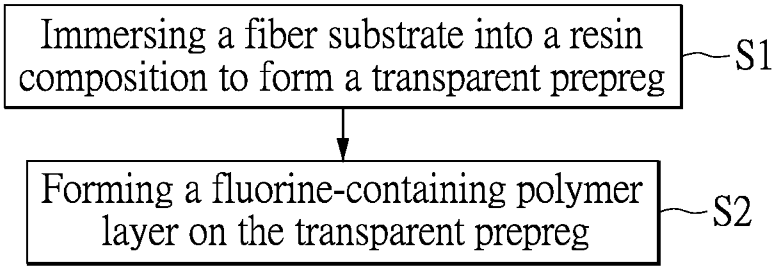
FIG. 3 is a flowchart of a method for manufacturing the back panel of the solar cell according the present disclosure.

Referring to FIG. 3, a method for manufacturing the back panel of the solar cell of the present disclosure includes: immersing the fiber substrate into the resin composition to form the prepreg 10 (step S1); and forming the fluorine-containing polymer layer 20 on the prepreg (step S2).

In order to demonstrate that the back panel of the present disclosure has good weather resistance, good heat resistance, a good barrier property and a good impact strength, back panels in Example 1 and Comparative Examples 1 and 2 are separately prepared in the present disclosure, and the back panels in Example 1 and Comparative Examples 1 and 2 are each bonded to an ethylene-vinyl acetate (EVA) copolymer layer, so as to simulate a situation where the back panel is mounted onto the solar cell module. Then, solar cell modules in Example 1 and Comparative Examples 1 and 2 undergo a packaging strength test, a water vapor penetration rate analysis, and a weather resistance analysis (an ultraviolet aging test and a hygrothermal environment test). Measurement results are shown in Table 1.

In Example 1, the back panel includes a prepreg 10 and a fluorine-containing polymer layer 20. The prepreg 10 is prepared specifically by: dissolving 75 PHR of a first epoxy resin (including the first epoxy resin represented by the formulas (a) to (d), a total phosphorus content thereof being 2.6 wt %, and a total epoxy equivalent thereof being 350 g/eq), 25 PHR of a second epoxy resin (i.e., the bisphenol A epoxy resin, an epoxy equivalent thereof being 186 g/eq), 34.87 PHR of a hardener (i.e., the phenolic resin) and 0.05 PHR of an accelerant (i.e., the 2-methylimidazole) in 207.5 PHR of methyl ethyl ketone, so as to form a resin composition; and then, immersing a fiber substrate (i.e., a fiberglass cloth) into the above-mentioned resin composition, setting a temperature of an immersing machine to be 180° C., and performing a drying process for 1 min to 5 min, so as to obtain the prepreg 10. The first epoxy resin in Example 1 includes: 30 PHR of the first epoxy resin represented by the formula (a), 15 PHR of the first epoxy resin represented by the formula (b), 15 PHR of the first epoxy resin represented by the formula (c) and 40 PHR of the first epoxy resin represented by the formula (d).

It should be noted that, when adjusting the drying time, a minimum melt viscosity of the prepreg is set to be 2,000 poises to 10,000 poises. Afterwards, when the prepreg is being hot-pressed and laminated, an effect of having a uniform laminating strength and a good light transmittance can be achieved.

A difference between Comparative Example 1 and Example 1 is that: the back panel in Comparative Example 1 only includes a prepreg 10, and does not include a fluorine-containing polymer layer 20.

In Comparative Example 1, the prepreg 10 is prepared specifically by: dissolving 75 PHR of a first epoxy resin (including the first epoxy resin represented by the formulas (a) to (d), a total phosphorus content thereof being 2.6 wt %, and a total epoxy equivalent thereof being 350 g/eq), 25 PHR of a second epoxy resin (i.e., the bisphenol A epoxy resin, an epoxy equivalent thereof being 186 g/eq), 34.87 PHR of a hardener (i.e., the phenolic resin) and 0.05 PHR of an accelerant (i.e., the 2-methylimidazole) in 207.5 PHR of methyl ethyl ketone, so as to form a resin composition; and then, immersing a fiber substrate (i.e., a fiberglass cloth) into the above-mentioned resin composition, setting the temperature of the immersing machine to be 180° C., and performing a drying process for 1 min to 5 min, so as to obtain the prepreg 10. The first epoxy resin in Comparative Example 1 includes: 30 PHR of the first epoxy resin represented by the formula (a), 15 PHR of the first epoxy resin represented by the formula (b), 15 PHR of the first epoxy resin represented by the formula (c) and 40 PHR of the first epoxy resin represented by the formula (d).

A difference between Comparative Example 2 and Example 1 is that: a resin composition for forming a prepreg 10 in Comparative Example 2 does not include a first epoxy resin.

The back panel in Comparative Example 2 includes the prepreg 10 and a fluorine-containing polymer layer 20. In Comparative Example 2, the prepreg 10 is prepared specifically by: dissolving 100 PHR of a second epoxy resin (i.e., the bisphenol A epoxy resin, an epoxy equivalent thereof being 186 g/eq), 34.87 PHR of a hardener (i.e., the phenolic resin) and 0.05 PHR of an accelerant (i.e., the 2-methylimidazole) in 207.5 PHR of methyl ethyl ketone, so as to form the resin composition; and then, immersing a fiber substrate (i.e., a fiberglass cloth) into the above-mentioned resin composition, setting the temperature of the immersing machine to be 180° C., and performing a drying process for 1 min to 5 min, so as to obtain the prepreg 10.

TABLE 1

| | | Example 1 | | | Comparative Example 1 | | | Comparative Example 2 | | |
|---|---|---|---|---|---|---|---|---|---|---|
| Packaging strength | | 90N | | | 89N | | | 87N | | |
| Water vapor penetration rate | | 0.5 cc/24 hrs | | | 0.6 cc/24 hrs | | | 0.55 cc/24 hrs | | |
| | (hr) | Hue change (b value) | Tension intensity ($kgf/cm^2$) | Elongation rate (%) | Hue change (b value) | Tension intensity ($kgf/cm^2$) | Elongation rate (%) | Hue change (b value) | Tension intensity ($kgf/cm^2$) | Elongation rate (%) |
| Ultraviolet aging test | 0 | 0 | 2,350 | 4.5 | 0 | 2,150 | 4.1 | 0 | 2,250 | 4.0 |
| | 200 | 0.85 | 2,019 | 4.1 | 16.6 | 2,150 | 4.1 | 0.75 | 1,950 | 4.1 |
| | 500 | 1.73 | 2,016 | 4 | 20.8 | 2,250 | 4.2 | 1.56 | 2,100 | 4.5 |
| | 1,000 | 2.15 | 2,413 | 4 | 22.5 | 2,050 | 4.1 | 2.04 | 2,300 | 4.2 |
| | 2,000 | 3.1 | 2,210 | 4.1 | 23.5 | 2,300 | 4 | 2.5 | 2,310 | 4.3 |
| | (hr) | Hue change (b value) | Tension intensity ($kgf/cm^2$) | Elongation rate (%) | Hue change (b value) | Tension intensity ($kgf/cm^2$) | Elongation rate (%) | Hue change (b value) | Tension intensity ($kgf/cm^2$) | Elongation rate (%) |
| Hygrothermal environment test | 0 | 0 | 2,150 | 4.1 | 0 | 2,150 | 4.1 | 0 | 2,050 | 3.7 |
| | 200 | 0.25 | 2,250 | 4.2 | 0.45 | 2,150 | 4.1 | 0.3 | 2,050 | 4.1 |
| | 500 | 0.3 | 2,050 | 4.1 | 0.71 | 2,250 | 4.2 | 0.35 | 2,150 | 4.7 |
| | 1,000 | 0.4 | 2,300 | 4 | 0.92 | 2,050 | 4.1 | 0.41 | 2,300 | 4.3 |
| | 2,000 | 0.45 | 2,315 | 4.2 | 0.74 | 2,300 | 4 | 0.42 | 2,300 | 4.5 |
| Fire resistance test | | the fire being able to self-extinguish within 10 seconds after ignition | | | the fire being able to self-extinguish within 10 seconds after ignition | | | the fire being inextinguishable after ignition | | |

In Table 1, the ultraviolet aging test is performed according to the IEC 61215 standard. After applying ultraviolet B (UVB) irradiation (wavelength: 280 nm to 320 nm; power: 0.90 $W/m^2$) for 0 hr to 2,000 hr, a yellowing index (ΔB) of each sample is measured. The results are shown in Table 1. The hygrothermal environment test involves performing a weather resistance test in an environment at 85° C. and at a relative humidity of 85%.

It can be observed from the results of Table 1 that, the prepreg 10 of the present disclosure has a good packaging strength (85 N to 95 N) with the ethylene-vinyl acetate (EVA) copolymer layer, and thus can replace the PET plate and the PVF layer in the conventional back panel. Since the back panel of the present disclosure has a characteristic of a low water vapor penetration rate (lower than 0.6 cc/24 hours), water vapor can be prevented from penetrating into the solar cell module.

It can be observed from the results of Table 1 that, the back panel of the present disclosure has good weather resistance, and shows little change in hue under ultraviolet irradiation or in a hygrothermal environment. Specifically, after being irradiated by ultraviolet light for 2,000 hours, the hue change of the back panel is less than 3.5. After being placed in an environment at 85° C. and at a relative humidity of 85% for 2,000 hours, the hue change of the back panel is less than 0.45.

Beneficial Effects of the Embodiments

In conclusion, in the back panel of the solar cell and the method for manufacturing the same provided by the present disclosure, by virtue of "the first epoxy resin containing phosphorus atoms, and an amount of the phosphorus atoms in the first epoxy resin ranging from 0.1 wt % to 5 wt %" and "the fluorine-containing polymer layer 20 being formed on the prepreg 10," the back panel of the solar cell can have improved heat resistance and weather resistance.

Further, by virtue of "the first epoxy resin being grafted with 6H-dibenzo[c,E][1,2]oxaphosphinine 6-oxide (DOPO)," the heat resistance and the weather resistance of the back panel of the solar cell can be enhanced.

Further, by virtue of "the resin composition further including 1 PHR to 50 PHR of a second epoxy resin" and "an epoxy equivalent of the second epoxy resin ranging from 100 g/eq to 2,000 g/eq," the barrier property and the impact strength of the back panel of the solar cell can be enhanced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A back panel of a solar cell, comprising:

a prepreg formed by immersing a fiber substrate into a resin composition, wherein, based on a total weight of the resin composition being 100 PHR (parts per hundred resin), the resin composition includes:

5 PHR to 70 PHR of a first epoxy resin, wherein the first epoxy resin contains phosphorus atoms, and an amount of the phosphorus atoms in the first epoxy resin ranges from 0.1 wt % to 5 wt %;

1 PHR to 20 PHR of a hardener; and 0.01 PHR to 10 PHR of an accelerant; and a fluorine-containing polymer layer formed on the prepreg, wherein the fiber substrate has a warp count of from 30 to 80 and a weft count of from 30 to 80;

wherein the first epoxy resin includes a structure represented by formula (d):

(d)

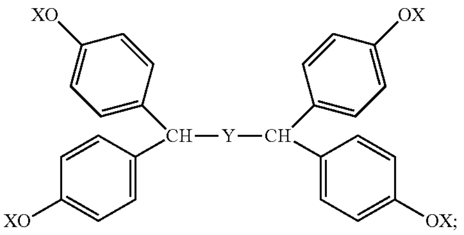

wherein at least one X in the formula (d) denotes

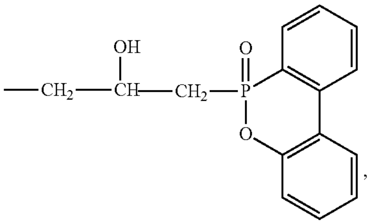

and remaining ones of X denote

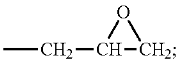

wherein Y denotes $-(CH_2)_n-$ or phenylene, and n is an integer from 0 to 6.

2. The back panel according to claim 1, wherein the first epoxy resin is grafted with 6H-dibenzo[c,E][1,2]oxaphosphinine 6-oxide (DOPO).

3. The back panel according to claim 1, wherein an epoxy equivalent of the first epoxy resin ranges from 200 g/eq to 1,000 g/eq, and a weight-average molecular weight of the first epoxy resin ranges from 100 g/mol to 1,000 g/mol.

4. The back panel according to claim 1, wherein the resin composition further includes 1 PHR to 50 PHR of a second epoxy resin, and an epoxy equivalent of the second epoxy resin ranges from 100 g/eq to 2,000 g/eq.

5. The back panel according to claim 4, wherein the second epoxy resin is selected from a group consisting of: a bisphenol A epoxy resin, a bisphenol F epoxy resin, a polybutadiene epoxy resin, a cresol formaldehyde novolac epoxy resin, a phenol formaldehyde novolac epoxy resin, a phenol biphenyl formaldehyde novolac epoxy resin, a phenol p-xylene formaldehyde novolac epoxy resin, a phenol biphenylene formaldehyde novolac epoxy resin, a phenol dicyclopentadiene formaldehyde novolac epoxy resin, a benzaldehyde novolac epoxy resin, a propylene glycol formaldehyde novolac epoxy resin, a resorcinol novolac epoxy resin, and any combination thereof.

6. The back panel according to claim 1, wherein the fiber substrate has a thickness that ranges from 0.05 mm to 0.5 mm, and the back panel of the solar cell has a light transmittance of above or equal to 85%.

7. The back panel according to claim 1, wherein a material of the fluorine-containing polymer layer is selected from a group consisting of: polyfluoroalkoxy (PFA), fluorinated ethylene propylene (FEP), ethylene tetrafluoroethylene (ETFE), an ethylene chlorotrifluoroethylene (ECTFE) copolymer, polyvinyl fluoride (PVF), polyvinylidene fluoride (PVDF), and any combination thereof.

8. The back panel according to claim 1, wherein a crosslinking degree of the prepreg ranges from 20% to 100%, and the prepreg is directly connected to a copolymer layer in a solar cell module.

9. A back panel of a solar cell, comprising:

a prepreg formed by immersing a fiber substrate into a resin composition, wherein, based on a total weight of the resin composition being 100 PHR (parts per hundred resin), the resin composition includes:

5 PHR to 70 PHR of a first epoxy resin, wherein the first epoxy resin contains phosphorus atoms, and an amount of the phosphorus atoms in the first epoxy resin ranges from 0.1 wt % to 5 wt %;

1 PHR to 20 PHR of a hardener; and 0.01 PHR to 10 PHR of an accelerant; and a fluorine-containing polymer layer formed on the prepreg;

wherein the fiber substrate has a warp count of from 30 to 80 and a weft count of from 30 to 80;

wherein the first epoxy resin consists of an epoxy resin including a structure represented by formula (a), an epoxy resin including a structure represented by formula (b), an epoxy resin including a structure represented by formula (c) and an epoxy resin including a structure represented by formula (d);

(a)

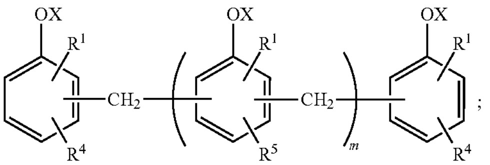

(b)

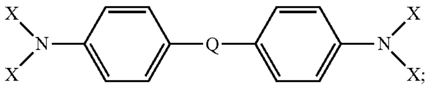

(c)

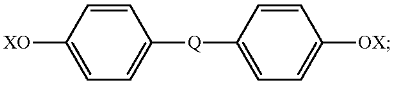

and

-continued
(d)
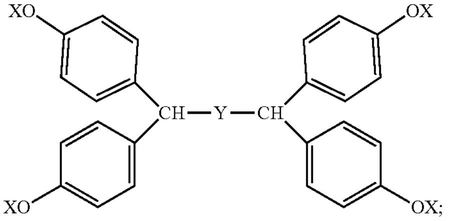
wherein at least one X in the formulas (a) to (d) denotes
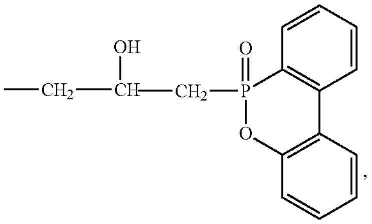
and remaining ones of X denote
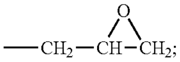
wherein m is an integer from 0 to 12;
wherein $R^1$ denotes a hydrogen atom or hydrocarbonyl with 1 to 4 carbon atoms;
wherein $R^4$ and $R^5$ each denote a hydrogen atom, methyl or
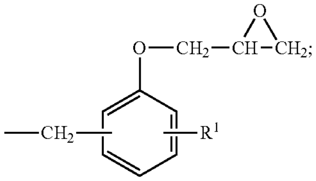
wherein O denotes
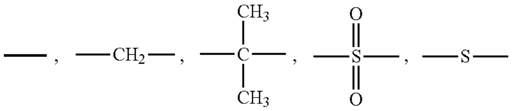 or
$-O-$;
wherein Y denotes $-(CH_2)_n-$ or phenylene, and n is an integer from 0 to 6.
* * * * *